US006994897B2

(12) United States Patent
Durocher et al.

(10) Patent No.: US 6,994,897 B2
(45) Date of Patent: Feb. 7, 2006

(54) METHOD OF PROCESSING HIGH-RESOLUTION FLEX CIRCUITS WITH LOW DISTORTION

(75) Inventors: Kevin Matthew Durocher, Waterford, NY (US); Christopher James Kapusta, Duanesburg, NY (US); Mehmet Arik, Niskayuna, NY (US); Richard Joseph Saia, Niskayuna, NY (US); Piet Moeleker, Latham, NY (US)

(73) Assignee: General Electric Company, Niskayuna, NY (US)

( * ) Notice: Subject to any disclaimer, the term of this patent is extended or adjusted under 35 U.S.C. 154(b) by 180 days.

(21) Appl. No.: 10/295,545

(22) Filed: Nov. 15, 2002

(65) Prior Publication Data

US 2004/0094329 A1  May 20, 2004

(51) Int. Cl.
 *A47G 1/12* (2006.01)

(52) U.S. Cl. .......................... 428/14; 428/209; 428/901

(58) Field of Classification Search ................ 428/209, 428/14, 901
See application file for complete search history.

(56) References Cited

U.S. PATENT DOCUMENTS

| 3,879,509 | A | * | 4/1975 | Elderbaum ..................... 419/9 |
| 3,955,021 | A | * | 5/1976 | Cleavenger ................... 428/81 |
| 4,802,945 | A | * | 2/1989 | Opina ........................ 156/247 |
| 5,474,458 | A | * | 12/1995 | Vafi et al. ..................... 439/91 |
| 5,627,903 | A | * | 5/1997 | Porrazzo et al. ............ 381/423 |
| 5,748,006 | A | * | 5/1998 | Sano .......................... 324/754 |
| 6,323,096 | B1 | * | 11/2001 | Saia et al. .................. 438/384 |

* cited by examiner

*Primary Examiner*—Cathy F. Lam
(74) *Attorney, Agent, or Firm*—Jean K. Testa; Patrick K. Patnode

(57) ABSTRACT

A mechanism and a method for framing a low-distortion flexible dielectric substrate during subsequent flex circuit processing. The processing method comprising the following steps: making a flexible dielectric substrate having an outer periphery; joining a continuous portion of the flexible dielectric substrate near the outer periphery to a rigid open frame, the flexible dielectric substrate being in a state other than a state of substantially uniform tension as a result of the joinder; causing the joined flexible dielectric substrate to undergo a change to the state of substantially uniform tension; and printing an electrical conductor on the flexible dielectric substrate while the flexible dielectric substrate is joined to the frame and in the state of substantially uniform tension. The frame is in the shape of a polygon (e.g., a rectangle) with rounded vertices.

12 Claims, 2 Drawing Sheets

METHOD OF PROCESSING HIGH-RESOLUTION FLEX CIRCUITS WITH LOW DISTORTION

BACKGROUND OF THE INVENTION

This invention generally relates to the manufacture of flexible printed circuit boards (hereinafter "flex circuits"). More specifically, the invention relates to the use of frames for processing flex circuits.

Current flex circuit manufacturing processes utilize roll-to-roll or large-panel fabrication equipment. For extremely high volume, roll-to-roll processing is perceived to be the lowest-cost approach.

However, the current state-of-the-art roll-to-roll processing requires 2-mil-thick polyimide film to maintain dimensional stability through the via formation, metal deposition and patterning steps. For double-sided flex circuitry and high-end flex circuitry, certain applications will require thinner polyimide, ultimately as thin as ½ mil. Current roll-to-roll production lines cannot handle this thickness of polyimide because of distortion issues during processing, and also because of alignment tolerances required for registration of double-sided flex circuitry with micro vias.

Organic polymeric materials such as polyimides have physical and electrical properties that are extremely susceptible to their environment, whether it be humidity, temperature, or processing history. Polyimide films in general have a large coefficient of thermal expansion (CTE) and a large coefficient of humidity expansion (CHE). Depending on the molecular structure, these values can vary significantly from one polymer to another. The properties of some polyimide films used in flex circuit production are summarized in Table1 (see Appendix).

The Kapton® polyimides are a product supplied by DuPont Microelectronics, Wilmington, Del., and the Upilex® polyimides are commercially available from Ube Chemicals, Japan. These polymers are manufactured on a roll-to-roll line and are supplied as thin films ranging in thickness from 0.5 to 5 mils. The physical properties may vary slightly from batch to batch depending on the exact nature of the manufacturing history. During flex circuit production, the polyimide film is exposed to varying temperature and humidity conditions that may cause expansion and shrinkage both in the plane of the film and perpendicular to the plane of the film. These temperature and humidity excursions result in pattern distortions that limit the size of features that can be patterned in high yield. To minimize these distortion issues, manufacturers have utilized 2-mil-thick polyimide film. Thicker polyimide can be handled in high-volume roll-to-roll manufacturing, whereas thinner polyimide films are more susceptible to heat and mechanical distortion in high-temperature bake and vacuum deposition steps.

Current panel processing relies on mechanical pins over which the flex film is registered during processing. Although it is possible to fabricate high-resolution structures over very small areas using this approach, the tolerance budget for double-sided fine-line flex circuitry makes this approach unmanufacturable. Other high-end flex circuit manufacturers resort to bonding the entire film to a rigid substrate during processing, and releasing the film upon completion. This approach requires additional processing, prevents the advantage of double-sided processing, induces stresses in the polyimide, and adds defects from the bonding material.

U.S. Pat. No. 6,323,096 discloses a method for fabricating a flexible interconnect film that involves using a rigid frame to support a dielectric film during processing. There is a continuing need for improved methods of fabricating flex circuits using rigid frames to support the workpiece and minimize distortion during processing.

BRIEF DESCRIPTION OF THE INVENTION

The invention is directed to a mechanism and a method for framing a low-distortion flexible dielectric substrate during subsequent flex circuit processing. The framing mechanism and method provide a way to handle thin flexible dielectric films in high-volume fine-line production facilities, controlling distortion, maximizing packing density, and allowing for either single- or double-sided processing. The method can also be used to fabricate multilayered flex circuits with laminations on one or both sides.

One aspect of the invention is an assembly comprising a rigid frame in the shape of a polygon with rounded vertices and a flexible film made of dielectric material bonded to and spanning the frame. The frame comprises a plurality of straight sections connected by a plurality of circular arcs. The material of the frame has a coefficient of thermal expansion less than the coefficient of thermal expansion of the dielectric material.

Another aspect of the invention is a method of processing a flex circuit with low distortion, comprising the step of bonding the edges of a flexible film made of dielectric material having a first coefficient of thermal expansion to a frame made of a rigid material having a second coefficient of thermal expansion less than the first coefficient of thermal expansion. The frame is in the shape of a polygon with rounded vertices.

A further aspect of the invention is a supported workpiece comprising a rigid frame having an opening and a flexible dielectric substrate joined to the frame and spanning the opening in a state of substantially uniform tension. Again, the frame is in the shape of a polygon with rounded vertices.

Yet another aspect of the invention is a method of processing a flex circuit comprising the following steps: making a flexible dielectric substrate having a thickness less than 2 mils and having an outer periphery; joining a continuous portion of the flexible dielectric substrate near the outer periphery to a rigid open frame, the flexible dielectric substrate being in a state other than a state of substantially uniform tension as a result of the joinder; causing the joined flexible dielectric substrate to undergo a change to the state of substantially uniform tension; and printing an electrical conductor on the flexible dielectric substrate while the flexible dielectric substrate is joined to the frame and in the state of substantially uniform tension.

Other aspects of the invention are disclosed and claimed below.

DETAILED DESCRIPTION OF THE INVENTION

Figure 1:
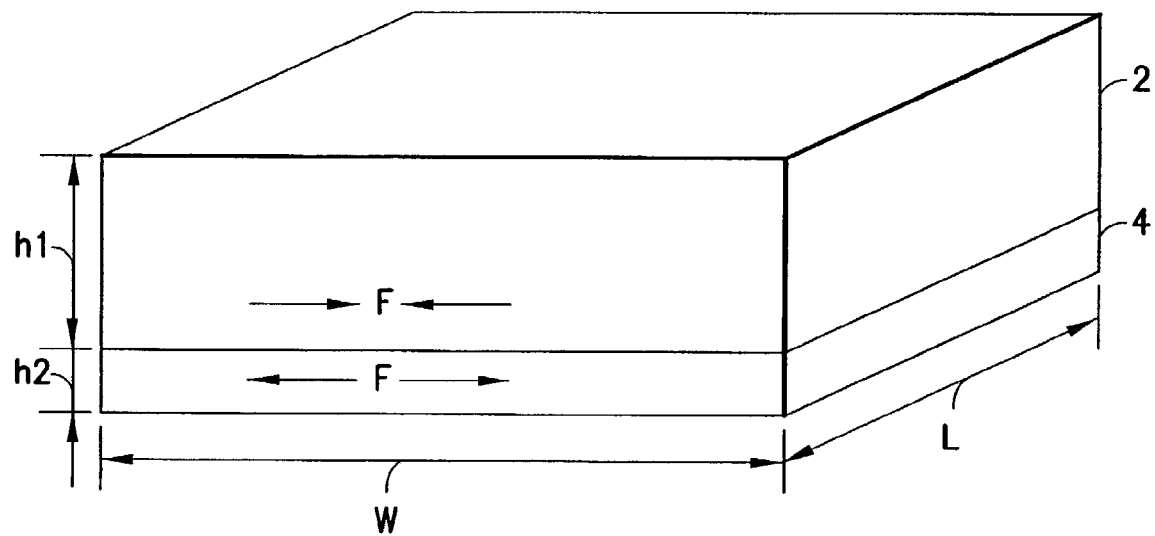
FIG. 1 is a schematic diagram of the interface between a frame and a membrane.

A major problem that currently exists in the flex industry is the ability to effectively and economically handle and hold dimensional stability on free-standing flex film through the process flow sequences. The major reason for this is related to the particular variation in physical properties of the flex film under varying humidity and temperature conditions. This issue has limited the ability to fabricate fine-line multilayer flex circuits. The roll-to-roll flex approaches have resorted to using thicker (2 mils) flex films, and typically work with minimum design rules of 2-mil lines and spaces. Current flex processing techniques are also limited in multilayer flex circuit applications (due to layer to layer registration related to dimensional stability). Circuit density limitations also exist due to the large (8–20 mils) pads required to capture via interconnect structures. As a result, dense routing of interconnect lines has not been achieved.

The present invention takes the approach of bonding the flex film onto a rigid frame. By only mounting the edges of the flex film on rigid frames, and bonding the film in place in such a way as to provide a slight uniform tension, distortion issues with flex film as thin as ½ mil are held in control. The flex framing technique can be scaled to larger frames compatible with high-volume manufacturing. The polyimide film is held in slight tension on the frame, and therefore is held in dimensional control through the entire processing sequence. The approach utilizes a frame structure chosen for its shape, thickness, modulus of elasticity, and coefficient of thermal expansion (CTE) characteristics. By having the CTE of the frame be slightly lower than the CTE of the polyimide film, the film can be bonded to the frame at elevated temperature with a thermosetting or thermoplastic adhesive. At elevated temperature the higher-CTE polymer material expands greater than the metal frame and is bonded to the frame as a uniform stretched film with the adhesive. Upon subsequent cooling to room temperature, the polymer contracts more than the metal frame does, giving rise to tension in the film, so that the film is held completely planar and firmly in place for single- or double-sided processing. Proper materials selection ensures that the polyimide film can be processed through the plating and etching baths and can handle the necessary excursions through the processing sequences. Using this approach, it should be possible to work with polymer films as thin as ½ mil and still retain the dimensional stability for processing. This is important for fine-line multilayer flex structures. Typical framing materials required for specific polyimide film types are shown in Table 2 in the Appendix.

By choosing the appropriate CTE characteristics of the frame material, the best candidate to achieve dimensional and distortion control of specific polyimide films can be predicted. For example, higher-CTE polyimides such as Kapton® H require a frame with CTE similar to that of titanium or stainless steel, whereas lower-CTE films such as Kapton® E or Upilex® S require a CTE value in the range found for Kovar or Invar By modeling the frame, one can predict the stresses of the polyimide film when stretched on a frame, as well as the stresses in the frame. From the model (described below) one can optimize the frame geometry to obtain a uniform strain across the film while keeping a larger area for greater device packing density. It was found that the radius of the frame corners played a large role in the local film strain uniformity and frame stress distribution. As long as there were no "sharp" corners the film strain would be more uniform. The best possible configuration for uniform film strain would be a circular frame, where there are no corner effects. Since this configuration would diminish the packing density greatly, only the corners of the frame were rounded.

The objective of the modeling was to design a frame over which a membrane material will be uniformly stressed. By affixing the membrane to a frame with a lower CTE at an elevated temperature, the CTE mismatch results in a membrane under tension when the membrane and frame cool, e.g., to room temperature. To first-order approximation, the stress inside the membrane follows from Equation (1), which appears in the Appendix, where E is the Young's modulus of the membrane, ÄT is the difference between the temperature during attachment of the membrane to the frame and room temperature, and á is the CTE. A subscript 1 denotes the frame and a subscript 2 denotes the membrane.

The membrane stress ó is uniform all across the interior of the membrane and does not depend on the particular shape of the frame, except for local effects near the edges of the film. Computational models using circular, square, and polygonal shapes for the frame corroborated this result.

The frame itself is stressed as a result of the force exercised by the stretched membrane. The goal is to minimize the frame stress by computing the appropriate frame geometry while maximizing the area enclosed by the frame.

FIG. 1 shows a sketch of the interface between the frame (material 2) and the membrane (material 4). Due to the higher CTE of the membrane, the membrane will be stretched and the frame compressed. Assuming perfect bonding (equal strain å in both materials), the bonding force F per unit width follows from Equation (2) (see Appendix), where h is the thickness of the material. The (average) stress inside the frame, ó$_1$, is given by Equation (3) in the Appendix.

The product Eh is called the stiffness of the material herein. Equation (2) shows that if the frame is much stiffer than the membrane, the bonding force will not change much by increasing the frame thickness. The average stress will decrease, but the maximum stress (close to the interface) will not.

Figure 2:
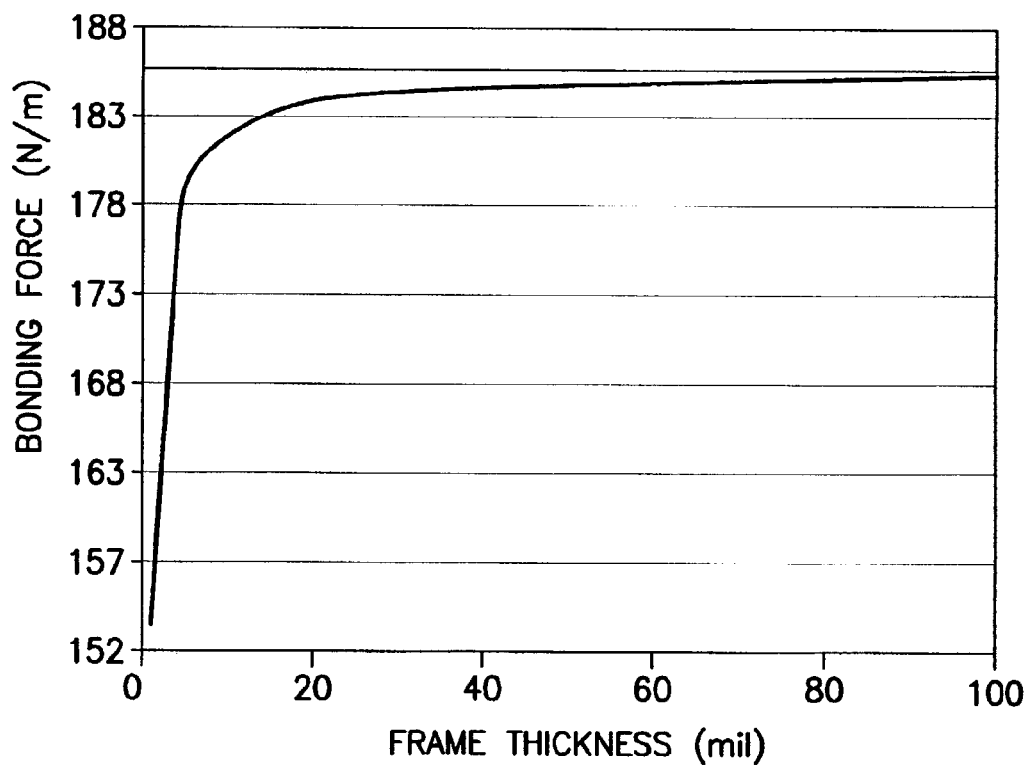
FIG. 2 is a graph showing the bonding force per unit width as a function of the thickness of an Invar frame for $\Delta T=175°$ C. This is for 1 mil Kapton E membrane with properties given in Table 3. The units for the bonding force are N/m.

As an illustration, consider a Kapton® membrane of 1-mil thickness on top of an Invar frame of variable thickness. Table 3 (see Appendix) gives a summary of the material properties of both materials. FIG. 2 shows the bonding force per unit width as a function of the frame thickness for ÄT=175° C. Note that for frames thicker than about 40 mils, the bonding force hardly changes. These frames are called thick frames. As it is expected that the maximum stress inside the frame is related to the bonding force and close to the interface, choosing a thicker frame than about 40 mil will not increase the strength of the frame significantly. The preferred frame thickness is in the range of 40–100 mils, but frames thicker than 100 mils may also be used.

The next step is to determine the optimal shape of the frame. For a given frame, the goal is to maximize the available area enclosed by the frame, thereby minimizing the maximum stress inside the frame. Different (computational) frames were built ranging from squares ones to circular ones and from polygonal ones to hybrid ones exhibiting straight and circular parts.

In order to maximize the area enclosed by a frame, a square frame is optimal, whereas a circular frame is optimal for minimizing the stresses. Any abrupt change in the tangent of the frame geometry (as in any corner) will introduce stress concentrations.

Figure 3:
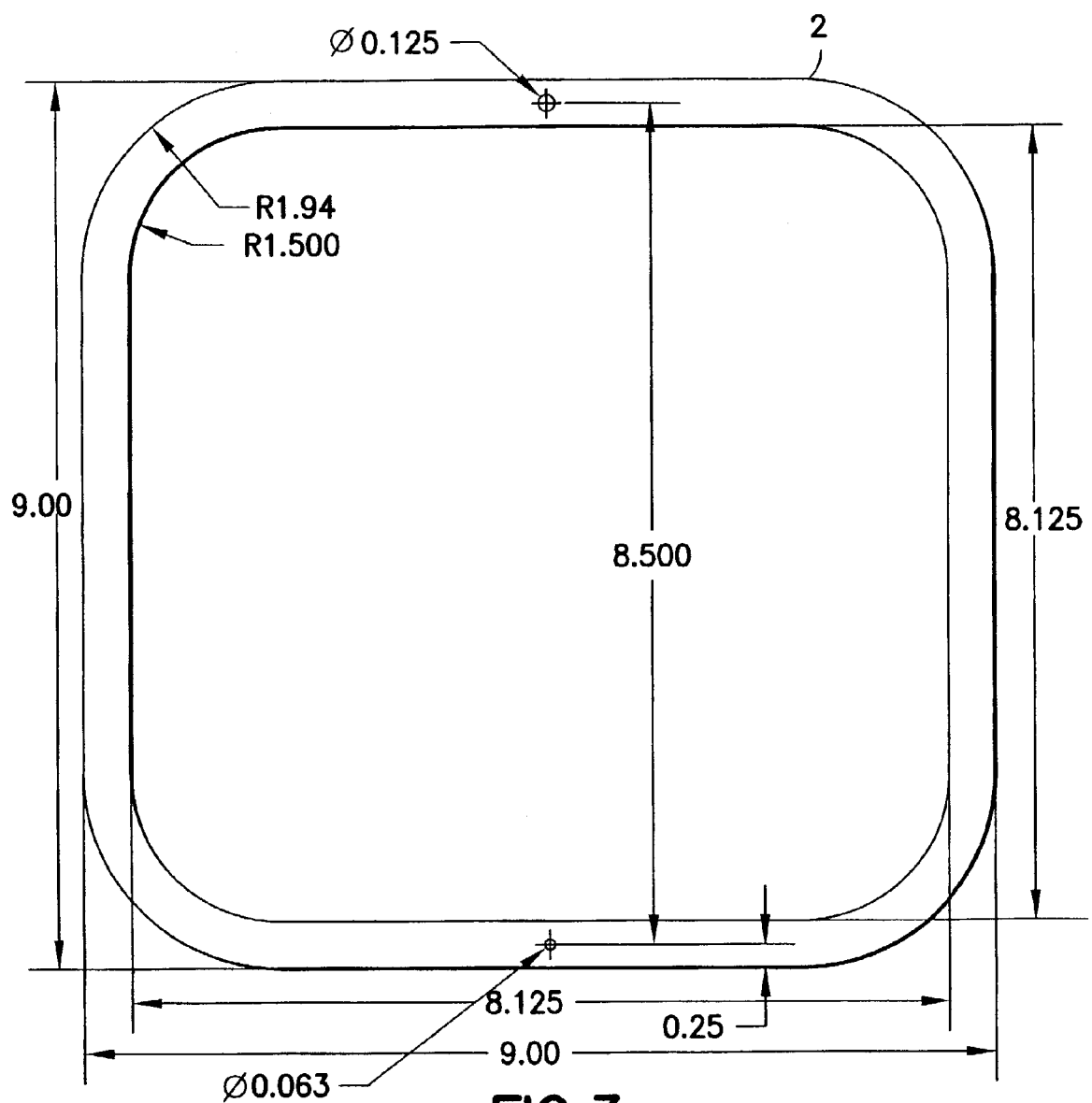
FIG. 3 is drawing showing a frame for processing flex film in accordance with one embodiment of the invention. The dimensions are given for one specific example for the sake of illustration.

A frame design in accordance with one embodiment of the invention is shown in FIG. 3, with dimensions being given for a particular example. In rough terms, the frame geometry for this example may be characterized as a square with rounded corners. The inside of the frame 2 consists of four straight sections, which form two pairs of parallel sections. Although in the particular example shown in FIG. 3, the respective pairs of parallel sections have the same length, these two parallel sections can have different lengths (e.g., a rectangle with rounded corners). The four straight sections are connected to each other using circular arcs resulting in no discontinuity in the tangent of the geometry. In general, the radii can be adjusted to increase or decrease the working area. Similar to the inside of the frame, the outside of the frame consists of four sections interconnected by circular arcs resulting in a continuous tangent along the outside of the frame. The inside frame arc and outside frame arc do not necessarily have the same center point, although they do have the same center point in the example depicted in FIG. 3. In addition, the ratio of the length of the circular arc to the length of the straight sections can vary. As limiting cases, a circle and a square will result. Small referencing holes of different diameters (1/8 and 1/16 inch respectively) are provided at the midpoints of opposing straight sections for referencing purposes, ensuring correct orientation of the frame on a processing machine, e.g., by pin registration.

The concept of the invention can be extrapolated to include frames having polygonal shapes other than squares and rectangles, e.g., triangles, trapezoids, hexagons, octagons, etc. In each case, the vertices of the polygon are rounded using circular arcs resulting in no discontinuity in the tangent of the geometry.

FIG. 3 shows the optimized frame design in a 9-inch format. The thickness of the frame is 1/16 inch. Each rounded corner has an outer radius of 1.94 inches and an inner radius of 1.5 inches. Larger frames would utilize the same corner radius bends. It was calculated that an Invar frame could be 50 mils thick for 25-micron Kapton® E polyimide and still be planar when under stress of the Kapton® material. The width of the frame was also calculated to be stable at approximately 0.50 inch.

Various adhesive types were evaluated for laminating flex film to frames for optimum dimensional stability of circuit patterns during processing. Thermoplastic as well as thermoset adhesives were evaluated. Ideally the lamination temperature, which is driven by the cure temperature of the adhesive, should be greater than the maximum operating temperature during circuit processing. Tests showed that thermoset materials (such as silicon polyimide epoxy (SPIE) or Shipley MP9500 epoxy, supplied by Shipley Company, Inc., Marlborough, Mass.) had better adhesion strength of the flex film to the frame material after the lamination bonding process.

The typical flex film-to-frame bonding process comprises the following steps: (1) removing any sharp edges and anomalies from the frame as a result of machining; (2) cleaning incoming frame material with solvent (e.g., acetone or propanol) to remove oils; (3) sanding the frame (especially metal) to impart roughness and increase adhesion to metals; (4) wiping the frame with solvent after sanding; (5) cleaning the frame with detergent (e.g., alconox); (6) cleaning the frame with HCl to remove oxides and loosen debris trapped in the grain structure of the material; (7) drying the frame material; (8) applying adhesive material (e.g., by roll coating, spraying, curtain coating, etc.) on one side of the frame; (9) soft baking the adhesive to a non-tacky state (i.e., the adhesive is not cured) to remove solvent; and (10) then pressing the flex film material onto the adhesive-coated side of the frame for a predetermined period of time under temperature and pressure conditions (e.g., at 200° C., 15,000 psi) suitable for bonding the flex film material to the frame.

Figure 4:
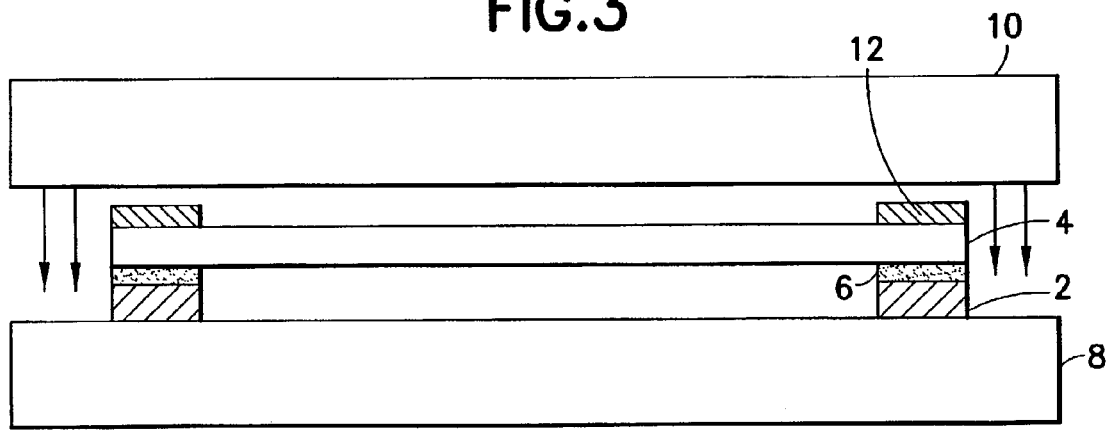
FIG. 4 is a drawing showing a partially sectioned side view of an arrangement for bonding a flex film to a frame in accordance with one method of manufacture.

One embodiment of equipment for performing the pressing step is shown in FIG. 4. The press comprises a bottom plate 8 and a top plate 10. The frame 2 is shown in cross section. The flex film 4 is bonded to the frame 2 by means of adhesive material 6. Optionally, a blotter 12 having the same shape as that of the frame is placed between the flex film 2 and the top press plate 10 in a position overlying the frame 4. Using a conformal high-temperature-resistant flexible blotter material (such as silicone rubber, 1/16 inch thick) can improve adhesive flow and aid in the reduction of voids. This can result in improved adhesion of the flex film 4 to the frame 2. This is more important when framing pre-metallized flex film, e.g., flex film with a film of Cu having a thickness of 4 or more microns deposited thereon. The addition of metal to the polyimide reduces the flexibility of the material and creates a less compliant lamination layer. The flatness of the press and blotter material are very significant in the framing process. If a blotter is used, the pressure can be reduced to 7,500 psi.

In the case where pristine flex film is laminated to the frame, the adhesive bond is formed between the flex film material and the frame. In the case where the flex film is metallized on the side facing the frame, the adhesive is formed between the metallization and the frame.

The above-described frames provide a means for handling and holding flex film during processing in such a way as to control distortion caused by changes in humidity or temperature. The shape of the frames is designed to control distortion and maximize the usable area for processing devices (packing density). Materials should be selected so that attachment of the flex film on the frame produces slight uniform tension to keep the flex film from wrinkling. With controlled distortion, the production of fine-line flex circuits (having 0.5- to 1-mil-wide lines and spaces) is possible using high-volume production equipment. The utilization of the above-described technique allows for the processing of high-end flex circuits using thin (0.5 and 1 mil thick) flexible films. The utilization of this technique also allows for both single- and double-sided flex film processing.

Thus the invention provides a way to handle thin flexible dielectric films in high-volume fine-line production facilities, controlling distortion, maximizing packing density, and allowing for either single- or double-sided processing. Once the dielectric film is bonded to the frame, vias can be formed in the film and then electrically conductive material (e.g., metal) is deposited on one or both sides of the dielectric film and inside the vias by conventional means. Then conductive structures are formed on the metallized surface or surfaces using conventional patterning techniques. The method can also be used to fabricate multilayered flex circuits with laminations on one or both sides. In other words, after the dielectric film attached to the frame has been processed on one or both sides, a second layer of dielectric film can be bonded to one side or the other (or to both sides). Then additional vias and conductive structures can be formed on the resulting laminated flex circuit. This process can be repeated until a multilayered flex circuit with the desired number of laminations on one or both sides of the film attached to the frame has been built. After flex circuit processing, the flex circuit is separated from the frame.

While the invention has been described with reference to preferred embodiments, it will be understood by those skilled in the art that various changes may be made and equivalents may be substituted for elements thereof without departing from the scope of the invention. In addition, many modifications may be made to adapt a particular situation to the teachings of the invention without departing from the essential scope thereof. Therefore it is intended that the invention not be limited to the particular embodiment disclosed as the best mode contemplated for carrying out this invention, but that the invention will include all embodiments falling within the scope of the appended claims.

As used in the claims, the term "rectangle" includes, but is not limited to, a square.

Appendix

Equations $$\sigma = (\alpha_2 - \alpha_1) E \Delta T \tag{1}$$

$$G = \frac{(\alpha_2 - \alpha_1)(\Delta T)}{\frac{1}{E_1 h_1} + \frac{1}{E_2 h_2}} \tag{2}$$

$$\sigma_1 = \frac{F}{h_1 W} = \frac{G}{W} \tag{3}$$

Tables

TABLE 1

Properties of Dielectrics Used in Flex Circuitry

| Property | Kapton H | Kapton E | Upilex S |
| --- | --- | --- | --- |
| CTE, x/y, 50–200° C. | 25–30 ppm | 14–17 ppm | 12 ppm |
| CTE, z, 50–200° C. | 60–70 ppm | 100 ppm | |
| Tg | >300° C. | >300° C. | >300° C. |
| Modulus (kpsi) | 400 | 720 | 1200 |
| Elongation, % | 72% | 40% | 30% |
| Moisture Absorption | 3.0% | 2.4% | 0.9% |
| Dielectric Constant | 3.4 | 3.2 | 3.3 |
| Dielectric Loss (1 kHz) | 0.002 | 0.0015 | 0.002 |

TABLE 2

CTE Characteristics of Various Materials

| Material | CTE @ 20° C. (ppm/° C.) | CTE @ 200° C. (ppm/° C.) | CTE @ 500° C. (ppm/° C.) | Density (g/cc) |
| --- | --- | --- | --- | --- |
| Aluminum | 23.1 | 26.4 | 34.0 | 2.70 |
| Invar | 0.13 | 5.1 | 17.1 | 8.08 |
| Kovar | 4.6 | 5.2 | | 8.41 |
| Stainless Steel (400 Series) | 9.7 | | | |
| Titanium | 8.6 | 9.9 | 11.1 | 4.50 |
| Tungsten | 4.5 | 4.6 | 5.0 | 19.35 |
| Carbon Fiber Epoxy Composite | 0–6 | 0–6 | | 1.63–1.72 |

TABLE 3

Material properties for Kapton E and Invar.

| Property | Kapton E | Invar |
| --- | --- | --- |
| E [N/m$^2$] | $2.9 \times 10^9$ | $14.1 \times 10^9$ |
| ν (Poisson's ratio) | 0.34 | 0.30 |
| CTE [1/° C.] | $17 \times 10^{-6}$ | $2.6 \times 10^{-6}$ |

The invention claimed is:

1. An assembly comprising a rigid frame in the shape of a polygon with rounded vertices and a first flexible film made of dielectric material bonded to and spanning said frame, wherein said frame comprises a plurality of straight sections connected by a plurality of circular arcs, and the material of said frame has a coefficient of thermal expansion less than the coefficient of thermal expansion of said dielectric material, wherein said frame has a thickness in the range of 40–100 mils and said frame has the shape of a square with rounded corners, the length of each side being substantially equal to 9 inches, the wall width being substantially equal to 0.5 inch, the outer radius of each corner being substantially equal to 1.94 inches, and the inner radius of each corner being substantially equal to 1.5 inches.

2. The assembly as recited in claim 1, wherein said dielectric material is polyimide.

3. The assembly as recited in claim 1, wherein said rigid frame is made of a material selected tram the group consisting of aluminum, Invar, Kovar, stainless steel, titanium, tungsten and carbon fiber/epoxy composite.

4. The assembly as recited in claim 1, wherein said flexible film has a thickness less than 2 mils.

5. The assembly as recited in claim 1, wherein said first flexible film is in a state of substantially uniform tension.

6. The assembly as recited in claim 1, wherein inner and outer radii of said circular arcs connect with said straight sections with substantially no discontinuity in the respective tangents to the inner and outer peripheries of said frame.

7. The assembly as recited in claim 1, wherein said frame comprises first and second referencing holes of different diameters.

8. The assembly as recited in claim 1, wherein one or both surfaces of said flex film are metallized.

9. The assembly as recited in claim 1, further comprising a printed circuit on one side of said first flexible film.

10. The assembly as recited in claim 1, further comprising a second flexible film made of dielectric material banded to said one side of said first flexible film with said printed circuit disposed between said first and second flexible films.

11. The assembly as recited in claim 1, further comprising a blotter placed on the side of said first flexible film opposite to said frame, wherein said blotter is made of conformal high-temperature-resistant flexible material.

12. The assembly as recited in claim 11, wherein said blotter is made of silicone rubber.

* * * * *